United States Patent [19]

Sueyoshi

[11] 4,356,453
[45] Oct. 26, 1982

[54] REDUCED NOISE-IMPROVED GAIN TRANSISTOR CIRCUIT

[75] Inventor: Susumu Sueyoshi, Tokyo, Japan
[73] Assignee: Pioneer Electronic Corporation, Tokyo, Japan
[21] Appl. No.: 117,590
[22] Filed: Feb. 1, 1980

[30] Foreign Application Priority Data

Feb. 8, 1979 [JP] Japan .................................. 54-13787

[51] Int. Cl.³ .............................................. H03F 3/16
[52] U.S. Cl. ........................................ 330/277; 330/264; 330/300
[58] Field of Search ................ 330/264, 267, 285, 265, 330/277, 300

[56] References Cited

U.S. PATENT DOCUMENTS

| | | | |
|---|---|---|---|
| 4,008,442 | 2/1977 | Todokoro | 330/277 |
| 4,021,751 | 5/1977 | Suzuki | 330/264 X |
| 4,086,542 | 4/1978 | Kamiya | 330/265 X |
| 4,092,612 | 5/1978 | Schade, Jr. | 330/264 X |
| 4,238,737 | 12/1980 | Yokoyama | 330/300 |

*Primary Examiner*—James B. Mullins
*Assistant Examiner*—Gene Wan
*Attorney, Agent, or Firm*—Sughrue, Mion, Zinn, Macpeak & Seas

[57] ABSTRACT

A grounded-source field-effect transistor amplifier circuit in which a constant current source is coupled to the source resistor to drain a current therethrough in addition to the normal source current with the amount of current chosen to equalize characteristics among different transistors. In a preferred application, two such transistors are coupled as a complementary pair with their drains connected to the inputs of a push-pull output stage. A variable resistor may be connected between the sources with its wiper connected to ground. A feedback resistor may be coupled between the output of the push-pull stage and the wiper of the variable resistor.

7 Claims, 9 Drawing Figures

REDUCED NOISE-IMPROVED GAIN TRANSISTOR CIRCUIT

BACKGROUND OF THE INVENTION

The present invention relates to a transistor circuit and more particularly to a grounded-source type field-effect transistor amplifier circuit.

Self-bias circuits have been extensively employed for field-effect transistors (FET). FIG. 1 shows a circuit diagram in which a self-bias circuit is used with a grounded-source type amplifier including an N-channel junction type depletion FET. In FIG. 1, the source of the transistor $Q_1$ is grounded through a biasing source resistor $R_S$ and a load resistor $R_D$ is connected to the drain. Reference character $R_i$ designates an input resistor. In this circuit, an input applied to the gate appears amplified on the drain output.

In the circuit thus constructed, the drain current $I_D$ makes the source positive with respect to ground making the gate negative with respect to the source. That is, the gate is biased reversely. This condition may be described by:

$$V_{GS} = -I_D \cdot R_S \tag{1}$$

where $V_{GS}$ is the gate-source voltage.

The input-output transmission characteristics of an N-channel depletion type FET are shown by the curves A and B in FIG. 2. The two curves A and B indicate example of variations in the input-output characteristics ($V_{GS} - I_D$ characteristics) for two different ones of such FET devices. Determination of the operating point by the source resistance $R_S$ is illustrated by a line $R_S$ in FIG. 2. As $I_D = -V_{GS}/R_S$ from equation (1), the line $R_S$ is a straight line passing through the origin in FIG. 2.

Therefore, if the source resistance $R_S$ of an FET is so selected that a drain current $I_{D1}$ flows as indicated by curve A, then the drain potential of the FET $Q_1$ will be $+V_{DD} - R_D \cdot I_{D1}$. On the other hand, if an FET having the characteristic curve B is employed in the circuit shown in FIG. 1, the drain current will be $I_{D2}$. In this case, the drain potential will be $+V_{DD} - R_D \cdot I_{D2}$, which may vary greatly from the case of an FET having the characteristics of curve A.

This undesirable variation can be eliminated by increasing the source resistance $R_S$. In this case, the inclination of the line $R_S$ decreases and the variation is reduced. However, this technique is disadvantageous in that the circuit gain is decreased accordingly. Furthermore, since the resistance $R_S$ is a part of the signal source resistance, increasing the resistance $R_S$ increases thermal noise in the circuit due to the resistance $R_S$ thereby decreasing the S/N ratio. As is clear from the above description, it is difficult to control the drain current by correcting variations in the characteristics of an FET element by adjusting the source resistance $R_S$.

Accordingly, an object of this invention is to provide a grounded-source type field-effect transistor circuit in which the source resistance is minimized to minimize the thermal noise in the circuit and to increase the circuit gain.

Another object of the invention is to provide a grounded-source type field-effect transistor circuit which can be effectively employed as the driver stage of an output push-pull amplifier circuit which is used as a power amplifier circuit or the like.

SUMMARY OF THE INVENTION

A transistor circuit according to the invention includes a grounded-source type FET circuit having a source resistor which is provided with a constant current source adapted to supply a predetermined current other than the drain current through the source resistor. In a transistor circuit of the invention, the current value of the constant current source is adjustable to correspond with the deviation in input-output transmission characteristics due to variations in the characteristics of the FET.

In the case where a transistor circuit of the invention is employed as the driver stage of a push-pull type power amplifier circuit, the transistor circuit may include first and second complementary FET's whose sources are grounded through first and second source resistors, respectively, and first and second constant current sources adapted to supply currents other than the drain currents to the first and second source resistors with the drain outputs of the first and second FET's being employed as the control inputs of the respective push-pull transistors.

Preferably, the current values of the first and second constant current sources are adjusted to eliminate deviations in input-output transmission characteristics of the FET's to make the drain output potentials equal to each other.

DESCRIPTION OF THE PREFERRED EMBODIMENTS

The invention will be described with reference to FIGS. 3 through 8.

Figure 1:
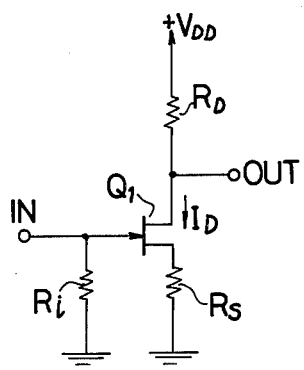
FIG. 1 is a circuit diagram showing an example of a conventional transistor circuit.
Figure 2:
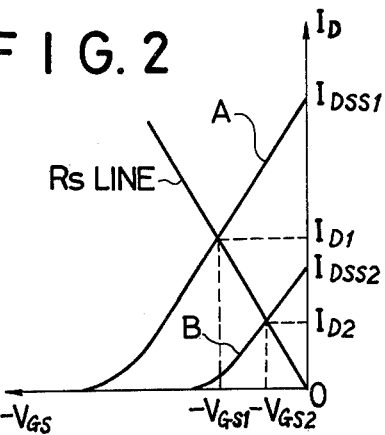
FIG. 2 is a graphical representation indicating the characteristics of FET transistors.
Figure 3:
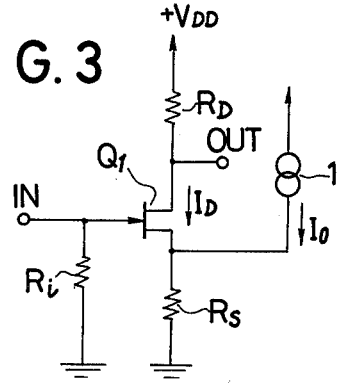
FIG. 3 is a circuit diagram showing an example of a transistor circuit according to the invention.

FIG. 3 is a circuit diagram showing a first example of a transistor circuit according to this invention. In FIG. 3, those components which have been described with reference to FIG. 1 are designated by like reference characters. The circuit in FIG. 3 differs from that in FIG. 1 in that a constant current source 1 has been added to the circuit in FIG. 1 so that, in addition to the drain current $I_D$, a constant current $I_O$ flows through the source resistor $R_S$. This situation is described by:

$$V_{GS} = -(I_D + I_O) \cdot R_S \tag{2}$$

Therefore, $$I_D = -V_{GS}/R_S - I_O \tag{3}$$

Figure 4:
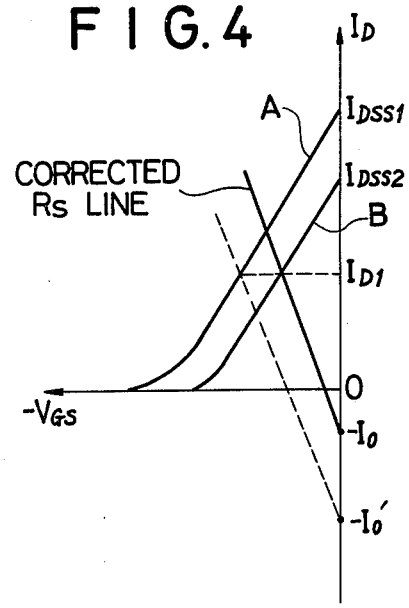
FIG. 4 is a graphical representation indicating the characteristic of the circuit shown in FIG. 3.

With regard to equation (3), the line $R_S$, corrected by the current source 1, is now related to the input-output transmission characteristic curve as indicated by the solid line in FIG. 4. In this case, with the value of the source resistor $R_S$ selected so that the drain current of an FET having the characteristic curve B is set to $I_{D1}$ by the predetermined constant current $I_O$, in order to make the drain current of an FET having the characteristic curve A also equal to $I_{D1}$, the solid line $R_S$ should be moved in parallel to a line $R_S$ as indicated by the dotted line in FIG. 4. This is accomplished by adjusting the constant current to a current value $I_O'$ with the resistance value of the source resistor $R_S$ maintained unchanged.

This means that voltage drop across the source resistor $R_S$ is produced not by the drain current alone but by the sum $I_D + I_O$. Accordingly, with the value of the source resistor $R_S$ maintained small and with the inclination of the corrected line $R_S$ accordingly being large, the value of the output voltage will be maintained unchanged irrespective of variations in the characteristic of the FET's. Thus, thermal noise contributed by the source resistor $R_S$ while the gain is maximized.

Figure 5:
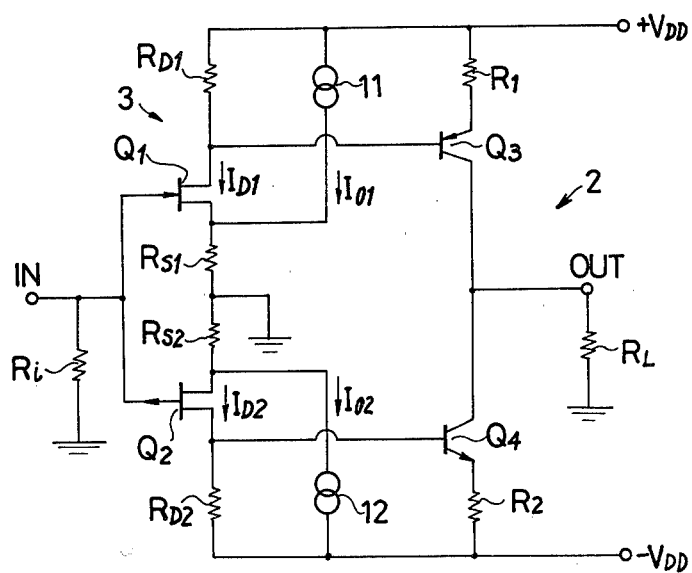
FIG. 5 is a circuit diagram illustrating an application of the circuit shown in FIG. 3.

FIG. 5 shows a driver stage 3 of a push-pull power amplifier circuit 2 in which the circuit shown in FIG. 3 is used. In FIG. 5, the sources of complementary FET's $Q_1$ and $Q_2$, whose gates are connected to each other, are grounded through source resistors $R_{S1}$ and $R_{S2}$, respectively. The drains of the FET's are connected through load resistors $R_{D1}$ and $R_{D2}$ to the positive and negative terminals of the power source, respectively. Constant current sources 11 and 12 are provided to supply constant currents $I_{O1}$ and $I_{O2}$ to the source resistors $R_{S1}$ and $R_{S2}$, respectively. The drain outputs of these FET's $Q_1$ and $Q_2$ are applied to the bases of complementary SEPP output transistors $Q_3$ and $Q_4$ whose collectors are connected to each other. The emitters of the transistors $Q_3$ and $Q_4$ are connected through respective resistors $R_1$ and $R_2$ to the positive and negative terminals of the power source. In FIG. 5, reference character $R_L$ designates a load.

Even if, where both of the selected values of the source resistors $R_{S1}$ and $R_{S2}$ are small, the FET's $Q_1$ and $Q_2$ have greatly different characteristics, the absolute values of the drain output potentials of the FET's can be made equal to each other by suitably selecting the drive current $I_{O1}$ and the attraction current $I_{O2}$ of the constant current sources 11 and 12.

Thus, the circuit shown in FIG. 5 achieves the same effect of the circuit shown in FIG. 3 wherein the base biases of the transistors $Q_3$ and $Q_4$ forming the push-pull amplifier 2 are made equal to each other. Accordingly, the circuit shown in FIG. 5 is advantageous in that the output currents of the two transistors $Q_3$ and $Q_4$ are equal to each other so that no offset output is produced.

Figure 6:
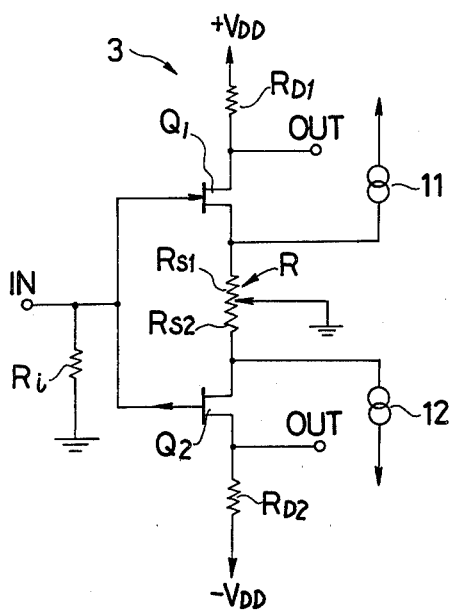
FIG. 6 is a circuit diagram showing another example of a transistor circuit according to the invention.

FIG. 6 is a circuit diagram showing another example of a transistor circuit according to the invention. The circuit shown in FIG. 6 is constructed by replacing the source resistors $R_{S1}$ and $R_{S2}$ in FIG. 5 by a variable resistor R. The sliding contact of the variable resistor R is grounded. The resistances between the sliding contact and two fixed contacts correspond to the aforementioned source resistors $R_{S1}$ and $R_{S2}$.

When the sliding contact is set to a given value, $R_{S2} = R - R_{S1}$ and $R_{S1} = \alpha R$, where $\alpha$ is a constant coefficient. Therefore, $R_{S2} = R - \alpha R = R(1 - \alpha)$.

Thus, the voltage drops across the source resistors can be represented by:

$$\left. \begin{array}{l} (I_{D1} + I_0) R_{S1} = (I_{D1} + I_0) \alpha R = -V_{GS1} \text{ and} \\ (I_{D2} + I_0) R_{S2} = (I_{D2} + I_0) (1 - \alpha) R = -V_{GS2} \end{array} \right\} \quad (4)$$

where the current values of the two constant current sources are selected to be equal to each other and $V_{GS1}$ and $V_{GS2}$ are the gate-source voltages of the two FET's $Q_1$ and $Q_2$, respectively.

In the circuit shown in FIG. 6, the values $V_{GS1}$ and $V_{GS2}$ can be varied in inverse proportion to each other by the variable resistor with the currents $I_O$ of the two constant current sources being equal. Therefore, the correct setting of drain current in the circuit shown in FIG. 6 by adjusting the single variable resistor can be achieved more readily than by adjustment of the two current sources in the circuit of FIG. 5. In the circuit shown in FIG. 6, the variable resistor can be used for correcting relative variations in characteristics of the FET's and the currents $I_O$ can be used for correcting absolute variations in the characteristic of the FET's. That is, the circuit in FIG. 6 provides a wide range of correction and is therefore suitable for mass production.

Figure 7:
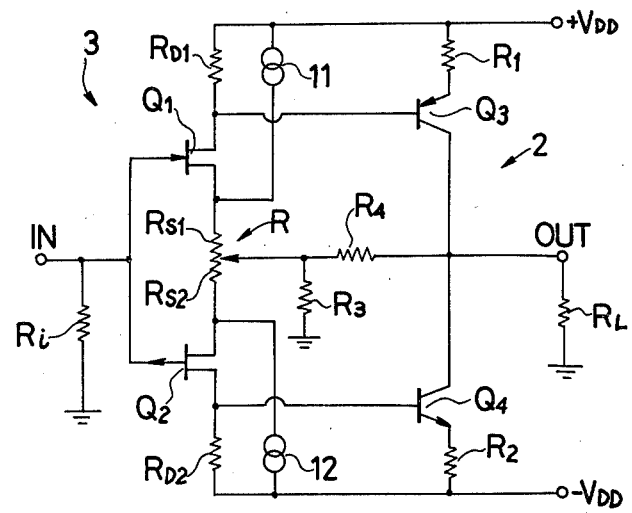
FIG. 7 is a circuit diagram showing an application of the circuit shown in FIG. 6.

FIG. 7 shows a so-called negative feedback (NFB) amplifier which is constructed by combining the circuit 3 of FIG. 6 with a push-pull amplifier 2. In FIG. 7, those components which have been previously described with reference to FIGS. 5 and 6 are therefore designated by like reference characters. In the circuit shown in FIG. 7, resistors $R_3$ and $R_4$ form a negative feedback circuit.

The variable resistor R is connected to change the gate-source voltages $V_{GS}$ of the FET's to make the drain currents $I_D$ equal to each other. Adjustment of the constant currents changes the absolute values thereof to eliminate variations in the drain correnerts $I_D$ and thereby maintaining constant the collector currents of the output push-pull transistors. Furthermore, the variable resistor R also may be used for midpoint offset adjustment while the constant current sources may be used for setting the idle currents of the output transistors.

Figure 8A:
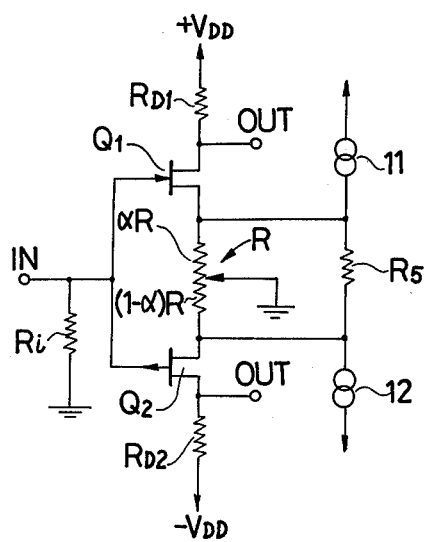
FIG. 8A is a circuit diagram showing a third example of a transistor circuit according to the invention.

A circuit shown in FIG. 8A is constructed by connecting a resistor $R_5$ in parallel with the variable resistor R in the circuit shown in FIG. 6 or 7. In general, a variable resistor having an extremely low nominal resistance is quite expensive. This economical problem is overcome by the circuit shown in FIG. 8. That is, in the circuit in FIG. 8, a variable resistor having a relatively high resistance is employed as the variable resistor R so as to reduce the manufacturing cost while yet the equivalent resistance of the combination with variable resistor is made low.

Figure 8B:
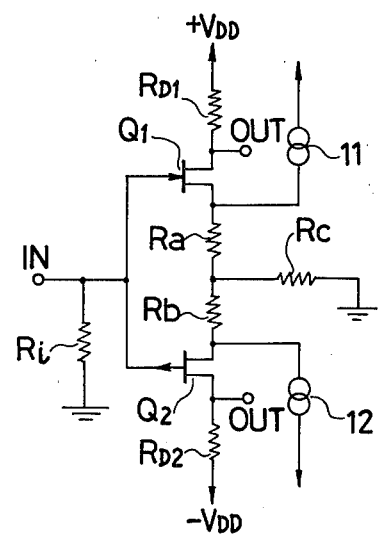
FIG. 8B is an equivalent circuit diagram of the circuit shown in FIG. 8A.

If the two parts of the resistance of the resistor R divided by the sliding contact are represented by $\alpha R$ and $(1 - \alpha)R$, respectively as shown in FIG. 8A and a so-called "delta-star" ($\Delta - Y$) conversion to the circuit of FIG. 8A is effected as indicated FIG. 8B, the following equations (5) result:

$$Ra = \frac{R_5 \cdot \alpha R}{\Delta} \approx \frac{R_5 \cdot \alpha R}{R} = \alpha R_5$$
$$Rb = \frac{R_5 \cdot (1-\alpha)R}{\Delta} \approx \frac{R_5 \cdot (1-\alpha)R}{R} = (1-\alpha)R_5 \quad (5)$$
$$Rc = \frac{\alpha R \cdot (1-\alpha)R}{\Delta} \approx \frac{\alpha R \cdot (1-\alpha)R}{R} = \alpha(1-\alpha)R$$
and
$$\Delta = R + R_5 \approx R (R \gg R_5)$$

It is apparent from equations (5) that the equivalent resistances Ra, Rb and Rc can be made very low.

As is clear from the above description, according to the invention, variations in the characteristics of FET's can be corrected without increasing the source resistances. Therefore, a circuit constructed according to the invention is free from difficulties such as circuit gain reduction and S/N ratio decrement. Furthermore, if the transistor circuit of the invention is employed as the driver of a push-pull power amplifier, then not only the above-described effects are obtained but the resulting circuit is also meritorious in that offset current can be reduced.

What is claimed is:

1. The transistor circuit comprising: a grounded-source type field-effect transistor; a source resistor coupled between the source of said transistor and a first potential; an adjustable constant current source coupled to supply a predetermined current other than a drain current to said source resistor; and a drain resistor coupled between the drain of said transistor and a second potential, an output from said circuit being taken from said drain.

2. The transistor circuit comprising: first and second complementary field-effect transistors; first and second source resistors through which are grounded respective sources of said transistors, said field-effect transistors being connected for grounded-source type operation; first and second adjustable constant current sources coupled to supply currents other than drain currents to said first and second source resistors, respectively; and first and second drain resistors coupled between the drains of said first and second field effect transistors and positive and negative potentials, respectively, outputs from said circuit being taken from said drains of said transistors.

3. The transistor circuit as claimed in claim 2 wherein the currents of said first and second constant current sources are equal in absolute value to each other and said first and second source resistors are two parts of the resistance of a variable resistor which is divided by a sliding contact of said variable resistor, said sliding contact being grounded.

4. The transistor circuit as claimed in claim 3 wherein said first and second source resistors include a fixed resistor connected in parallel with said variable resistor.

5. The transistor circuit as claimed in claim 4 wherein the entire resistance of said variable resistor is significantly higher than the resistance of said fixed resistor connected in parallel with said variable resistor.

6. The transistor circuit as claimed in any of claims 2-5 further comprising: first and second output transistors connected in a push-pull circuit arrangement, said first and second output transistors having control electrodes coupled to corresponding drains of said field-effect transistors.

7. The transistor circuit as claimed in any of claims 3-5 further comprising: first and second output transistors connected in a push-pull circuit arrangement, said first and second output transistors having control electrodes coupled to corresponding drains of said field-effect transistors; and a feedback resistor coupled between an output point of said first and second output transistors and said wiper of said variable resistor, said wiper being grounded through a resistor.

* * * * *